(12) United States Patent
Lee et al.

(10) Patent No.: US 6,657,299 B2
(45) Date of Patent: Dec. 2, 2003

(54) SEMICONDUCTOR WITH A STRESS REDUCTION LAYER AND MANUFACTURING METHOD THEREFOR

(75) Inventors: Jae Suk Lee, Gyeonggi-do (KR); Seung Hyun Kim, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/304,697

(22) Filed: Nov. 27, 2002

(65) Prior Publication Data

US 2003/0098501 A1 May 29, 2003

(30) Foreign Application Priority Data

Nov. 28, 2001 (KR) .......................................... 2001-74628

(51) Int. Cl.⁷ ................................................ H01L 23/48
(52) U.S. Cl. .................... 257/737; 257/617; 438/613
(58) Field of Search ................................ 257/737, 778, 257/738, 734, 678, 746, 617; 438/613, 611

(56) References Cited

U.S. PATENT DOCUMENTS

| 6,368,485 B1 | * | 4/2002 | Ue et al. | 205/234 |
| 2002/0121703 A1 | * | 9/2002 | Toyoda et al. | 29/40 |
| 2003/0015802 A1 | * | 1/2003 | Watanabe | 257/774 |

* cited by examiner

*Primary Examiner*—Roy Potter
(74) *Attorney, Agent, or Firm*—Jacobson Holman PLLC

(57) ABSTRACT

A surface of a metal wiring formed over a portion of a substrate is oxidized and annealed to generate a stress reduction layer. Then a passsivation layer is deposited over the stress reduction layer and the remaining portions of the substrate so that a semiconductor with the stress reduction layer may be formed.

15 Claims, 1 Drawing Sheet

SEMICONDUCTOR WITH A STRESS REDUCTION LAYER AND MANUFACTURING METHOD THEREFOR

FIELD OF THE INVENTION

The present invention relates to a passivation layer in a semiconductor; and, more particularly, to a semiconductor with a stress reduction layer to prevent a passivation layer from being cracked during a packaging process and a manufacturing method therefor.

BACKGROUND OF THE INVENTION

Generally, a passivation layer in a semiconductor acts as a protective coating to protect the underlying surface from physical and chemical reaction, e.g., scratch, corrosion, electro-dissolution, during a packaging process. Such passivation layer protects the semiconductor from being damaged by an environmental factor such as humidity. Such passivation layer is made of a combination of one or more oxide layers for stress reduction and one or more nitride layers for a protective coating.

For example, a plasma enhanced tetra ethyl ortho silicate (PETEOS) oxide layer is deposited on a substrate with a metal wiring by using the plasma enhanced chemical vapor deposition (PECVD) technique and further a $SiH_4$ nitride layer is deposited over the PETEOS oxide layer by using the PECVD technique to form a passivation layer. Alternatively, a $SiH_4$ oxide layer may be deposited by using the high density plasma (HDP) CVD technique and then a $SiH_4$ nitride layer may be deposited over the $SiH_4$ oxide layer by using the PECVD technique to form another passivation layer.

While a top metal wiring in a conventional semiconductor has a relatively thin thickness of about 5000 to 6000 angstroms, a top metal wiring in a semiconductor such as a multilayer wiring device or a power device has a thicker thickness of about 8000 to 10000 angstroms. Further, the top metal wiring in the power device extends to a wide region therein.

Such a passivation layer formed over the top metal wiring of the multiplayer wiring device or the power device may suffer from cracking, due to stress caused by an underlying metal wiring that are wide and thick. Therefore, there has been a long felt need for a stress resistant passivation layer having a low stress on the underlying metal wiring, as well as being robust to an external impact.

SUMMARY OF THE INVENTION

It is, therefore, an object of the present invention to provide a semiconductor with a stress reduction layer to prevent a passivation layer from being cracked during a packaging process and a manufacturing method therefor.

In accordance with one aspect of the present invention, there is provided a

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1A:
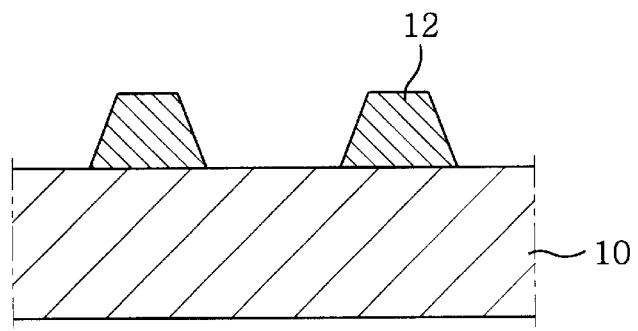
FIGS. 1A to 1C represent cross-sectional views for illustrating a manufacturing process of a semiconductor with a stress reduction layer in accordance with the present invention.
Figure 1B:
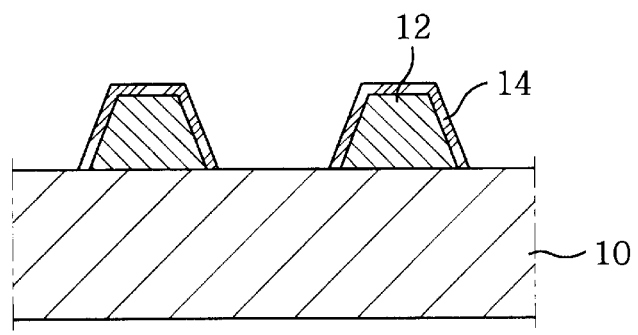
Figure 1C:
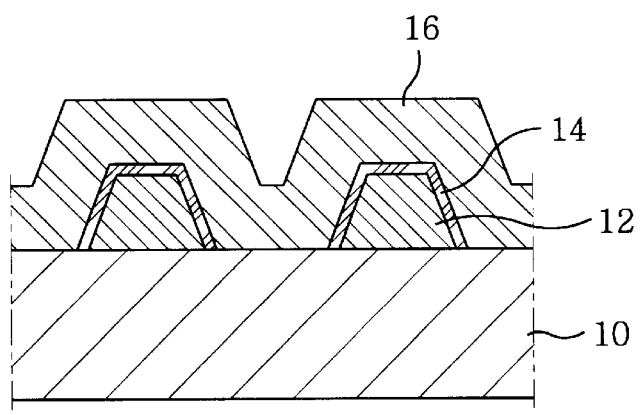

Referring to FIGS. 1A to 1C, there is shown a method for manufacturing a semiconductor with a stress reduction layer in accordance with the present invention.

Referring to FIG. 1A, a substrate 10, preferably a silicon substrate, is provided. It is known that an impurity injection layer such as a source and a drain, a gate electrode, an interlayer insulation layer and a metal wiring may be formed in the substrate 10, although they have not been illustrated.

In a deposition process, e.g., a sputtering process, an Al metal layer (not shown) is deposited for a metal wiring 12 on the substrate 10. Such Al metal layer preferably has a thickness of about 8000 to 10000 angstrom. A photoresist mask pattern (not shown) is formed over the Al metal layer, wherein the photoresist mask pattern corresponds to the metal wiring 12 as will be described thereinafter. The photoresist mask pattern is used to etch the Al metal layer to the substrate 10 so that the metal wiring 12 may be formed over a portion of the substrate 10 with the other portion of the substrate exposed. Although only two metal wirings 12 are shown in FIG. 1A, a number of metal wirings 12 may be formed on the substrate 10.

Referring to FIG. 1B, the metal wiring 12 is subjected to a plasma process in $N_2O$ or $O_2$ atmosphere so that a thin metal oxide layer, e.g., an Al oxide layer, with a thickness of less than about 100 angstroms may be formed over the metal wiring 12. Then, the thin metal oxide layer is annealed to form a stress reduction layer 14. For example, the Al oxide layer may be annealed in an inert gas atmosphere of Ar, He or a combination thereof, as well as a gas atmosphere of $N_2O$, $O_2$, $N_2$, $H_2$ or combinations thereof. The annealing process takes place at a lower temperature below about 400 degrees Celsius for about 10 minutes to about 24 hours, preferably for about 4 hours. Rapid thermal process or conventional furnace thermal process may be used. Accordingly, the metal wiring 12 with the stress reduction layer coated thereon may be formed over a portion of the substrate 10 while the other portion of the substrate 10 remains exposed.

Referring to FIG. 1C, a plasma enhanced chemical vapor deposition (PECVD) may be used to form a passivation layer 16 over the stress reduction layer 14 and the other portion, i.e., the exposed portion, of the substrate 10. The thickness of the passivation layer 16 is preferably substantially equal to that of the metal wiring 12 so that the passivation layer 16 is about 8000 to 10000 angstroms in thickness. In case the metal wiring 12 is made of Al, the passivation layer 16 is preferably made of $Al_xO_y$ composition. Further, it is preferable that the $Al_xO_y$ composition has a major composition of $Al_2O_3$, which is thermally stable and has a lower stress against Al.

The passivation layer 16 may be annealed in an inert gas atmosphere of Ar, He or a combination thereof. Alternatively, the passivation layer 16 may be annealed in a gas atmosphere of $N_2O$, $O_2$, $N_2$, $H_2$ or combinations thereof. The annealing process takes place at a lower temperature below about 400 degrees Celsius for about 10 minutes to about 24 hours, preferably for about 4 hours. Rapid thermal process or conventional furnace thermal process may be used. After the annealing process, the density of the passivation layer 16 increases so that the breakdown voltage of the passivation layer 16 may increase.

The stress reduction layer 14 reduces the stress on the passivation layer 16, caused by the metal wiring 12, while providing greater robustness. More specifically, the stress reduction layer 14 protects the passivation layer 16 from being cracked thus the leakage current of the semiconductor may be reduced and the breakdown voltage of the semiconductor may be increased.

While the invention has been shown and described with respect to the preferred embodiments, it will be understood by those skilled in the art that various changes and modifications may be made without departing from the spirit and scope of the invention as defined in the following claims.

What is claimed is:

1. A semiconductor comprising:
    a substrate with one or more elements incorporated therein;
    a metal wiring formed over a portion of the substrate;
    a metal oxide layer for covering the metal wiring, wherein the metal oxide layer is formed by a plasma process on the metal wiring;
    a stress reduction layer formed by a thermal process on the metal oxide layer; and
    a passivation layer deposited over the stress reduction layer and the other portion of the substrate,
    wherein the passivation layer is made of a metal oxide layer and the stress reduction layer reduces stress between the metal oxide layer and the passiration.

2. The semiconductor of claim 1, wherein the stress reduction layer is less than about 100 angstroms in thickness.

3. The semiconductor of claim 1, wherein the metal wiring is made of Al and the passivation layer is made of aluminum oxide.

4. The semiconductor of claim 1, wherein the surface of the metal wiring is oxidized with a plasma process in $N_2O$ atmosphere to generate the metal oxide layer.

5. The semiconductor of claim 1, wherein the surface of the metal wiring is oxidized with a plasma process in $O_2$ atmosphere to generate the metal oxide layer.

6. The semiconductor of claim 1, wherein the metal oxide layer is thermal-processed at a temperature below about 400 degrees Celsius to generate the stress reduction layer.

7. The semiconductor of claim 1, wherein the metal oxide layer is thermal-processed in an inert gas atmosphere selected from a group of Ar, He and a combination thereof to generate the stress reduction layer.

8. The semiconductor of claim 1, wherein the thin metal oxide layer is thermal-processed in a gas atmosphere selected from a group of $N_2O$, $O_2$, $N_2$, $H_2$ and combinations thereof to generate the stress reduction layer.

9. A method for manufacturing a semiconductor comprising the steps of:
    (a) forming a metal wiring over a portion of a substrate;
    (b) covering the metal wiring with a stress reduction layer; and
    (c) depositing a passsivation layer over the stress reduction layer and the remaining portions of the substrate,
    wherein the passivation layer is made of a metal oxide layer and the stress reduction layer reduces stress between the metal wiring and the passivation layer.

10. The method of claim 9, wherein the step (b) includes the steps of:
    (b1) oxidizing a surface of the metal wiring to obtain a thin metal oxide layer; and
    (b2) annealing the thin metal oxide layer to generate the stress reduction layer.

11. The method of claim 10, wherein the surface of the metal wiring is oxidized with a plasma process in $N_2O$ atmosphere.

12. The method of claim 10, wherein the surface of the metal wiring is oxidized with a plasma process in $O_2$ atmosphere.

13. The method of claim 10, wherein the thin metal oxide layer is annealed at a temperature below about 400 degrees Celsius.

14. The method of claim 10, wherein the thin metal oxide layer is annealed in an inert gas atmosphere selected from a group of Ar, He and a combination thereof.

15. The method of claim 10, wherein the thin metal oxide layer is annealed in a gas atmosphere selected from a group of $N_2O$, $O_2$, $N_2$, $H_2$ and combinations thereof.

* * * * *